(12) United States Patent
Kim et al.

(10) Patent No.: US 9,323,672 B2
(45) Date of Patent: *Apr. 26, 2016

(54) SCATTER-GATHER INTELLIGENT MEMORY ARCHITECTURE FOR UNSTRUCTURED STREAMING DATA ON MULTIPROCESSOR SYSTEMS

(71) Applicant: Intel Corporation, Santa Clara, CA (US)

(72) Inventors: Daehyun Kim, San Jose, CA (US); Christopher J. Hughes, Santa Clara, CA (US); Yen-Kuang Chen, Cupertino, CA (US); Partha Kundu, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/585,573

(22) Filed: Dec. 30, 2014

(65) Prior Publication Data

US 2015/0178200 A1 Jun. 25, 2015

Related U.S. Application Data

(63) Continuation of application No. 14/048,291, filed on Oct. 8, 2013, now Pat. No. 8,954,674, which is a continuation of application No. 13/782,515, filed on Mar. 1, 2013, now Pat. No. 8,966,180, which is a continuation of application No. 13/280,117, filed on Oct. 24, 2011, now Pat. No. 8,578,097, which is a continuation of application No. 11/432,753, filed on May 10, 2006, now Pat. No. 8,074,026.

(51) Int. Cl.
*G06F 12/08* (2006.01)
*G11C 7/10* (2006.01)

(52) U.S. Cl.
CPC ............ *G06F 12/0806* (2013.01); *G06F 12/08* (2013.01); *G06F 12/0811* (2013.01); *G06F 12/0815* (2013.01); *G06F 12/0817* (2013.01); *G06F 12/0862* (2013.01); *G06F 12/0877* (2013.01); *G06F 12/0891* (2013.01); *G06F 12/0897* (2013.01); *G11C 7/1072* (2013.01);
(Continued)

(58) Field of Classification Search
CPC .......... G06F 12/0866; G06F 17/30902; G06F 12/0862; G06F 12/08; G06F 12/0804; G06F 2212/6026; G06F 12/0802; G06F 12/0806; G06F 2212/2022; G06F 2212/62; G06F 12/0815; G06F 12/0817; G06F 12/0877; G06F 12/0891
USPC ......... 711/118, 120, 128, 131–143, 147, 212, 711/217–218
See application file for complete search history.

(56) References Cited

U.S. PATENT DOCUMENTS 5,524,265 A * 6/1996 Balmer et al. .................. 712/38
5,781,926 A 7/1998 Gaskins et al.
(Continued)

OTHER PUBLICATIONS

John Carter et al.; Impulse: Building a Smarter Memory Controller.; Department of Computer Science, University of Utah; Intel Corporation.; pp. 10.

(Continued)

*Primary Examiner* — Zhuo Li
(74) *Attorney, Agent, or Firm* — Trop, Pruner & Hu, P.C.

(57) ABSTRACT

A scatter/gather technique optimizes unstructured streaming memory accesses, providing off-chip bandwidth efficiency by accessing only useful data at a fine granularity, and offloading memory access overhead by supporting address calculation, data shuffling, and format conversion.

19 Claims, 8 Drawing Sheets

(52) U.S. Cl.
CPC ...... *G11C 7/1075* (2013.01); *G06F 2212/6026* (2013.01); *G06F 2212/62* (2013.01); *Y02B 60/1225* (2013.01)

(56) References Cited

U.S. PATENT DOCUMENTS

| | | | | |
|---|---|---|---|---|
| 6,240,492 | B1* | 5/2001 | Foster et al. | 711/149 |
| 6,339,813 | B1 | 1/2002 | Smith, III | |
| 6,694,407 | B1 | 2/2004 | May et al. | |
| 6,976,126 | B2 | 12/2005 | Clegg et al. | |
| 7,133,975 | B1 | 11/2006 | Isaac et al. | |
| 7,325,101 | B1 | 1/2008 | Iacobovici et al. | |
| 7,865,669 | B2 | 1/2011 | Komegay | |
| 8,074,026 | B2* | 12/2011 | Kim et al. | 711/118 |
| 8,578,097 | B2* | 11/2013 | Kim et al. | 711/118 |
| 8,954,674 | B2* | 2/2015 | Kim et al. | 711/118 |
| 8,966,180 | B2* | 2/2015 | Kim et al. | 711/118 |
| 2007/0050553 | A1* | 3/2007 | Hsu et al. | 711/122 |
| 2007/0255903 | A1 | 11/2007 | Tsadik et al. | |
| 2012/0042121 | A1 | 2/2012 | Kim et al. | |

OTHER PUBLICATIONS

Won W. Ro et al.; HiDISC: A Decoupled Architecture for Data-Intensive Applications; IEEE Computer Society; 07-7695-1926-1(C) 2003IEEE; Proceedings of the International Parallel and Distributed Processing Symposium (IPDPS'03).; pp. 8.

Roger Espasa et al.; Tatantula: A Vector Extension to the Alpha Architecture.; IEEE 2002, 1063-6897/02.; pp. 281-292.

Mainak Chaudhuri et al.; Cache Coherence Protocol Design for Active Memory Systems; Computer Systems Laboratory, Cornell University, Ithaca, NY, U.S.A.; pp. 7.

* cited by examiner

SCATTER-GATHER INTELLIGENT MEMORY ARCHITECTURE FOR UNSTRUCTURED STREAMING DATA ON MULTIPROCESSOR SYSTEMS

This application is a continuation of U.S. patent application Ser. No. 14/048,291, filed Oct. 8, 2013, which is a continuation of U.S. patent application Ser. No. 13/782,515, filed Mar. 1, 2013, which is a continuation of U.S. patent application Ser. No. 13/280,117, filed Oct. 24, 2011, now U.S. Pat. No. 8,578,097, issued Nov. 5, 2013, which is a continuation of U.S. patent application Ser. No. 11/432,753, filed May 10, 2006, now U.S. Pat. No. 8,074,026, issued Dec. 6, 2011, the content of which is hereby incorporated by reference.

FIELD OF THE INVENTION

This disclosure relates to microprocessor systems and in particular to memory architectures in a microprocessor system.

BACKGROUND

Access latency to main memory (external memory) has lagged behind increases in processor speed resulting in a performance bottleneck. To decrease access latency, many processors include integrated on-chip caches that hold large contiguous data blocks (cache lines) fetched from main memory based on spatial and temporal locality. Spatial locality is the concept that the likelihood of referencing data is higher if data near it was just referenced. Temporal locality is the likelihood that data that is referenced at one point in time will likely be referenced again sometime in the near future.

Though many applications have data access patterns that exhibit temporal and spatial locality, there also exist classes of applications with data access patterns that do not. For example, some multi-media applications, database and signal processing applications do not exhibit a high degree of temporal and spatial locality. Also, some stride access patterns and indirect access patterns used in many data intensive applications do not exhibit a high degree of temporal and spatial locality.

Off-chip communication in conventional cache architectures is inefficient because data management is sized by cache line. If data access patterns do not exhibit spatial locality, only a small portion of a cache line is actually used, and memory bandwidth used for accessing the other part of the cache line is wasted. In addition, because data buffering is also based on an entire cache line, the efficiency of cache is low, resulting in more cache misses and more off-chip communication.

In addition, conventional processor architectures do not take advantage of parallelism in memory accesses. To prepare operands of a computation, that is, values on which an instruction operates, a processor may incur large overheads such as address calculation and data format conversion in addition to the actual memory accesses. Though pure memory latency is one cause of the performance bottleneck, the memory access overhead also contributes to access latency.

BRIEF DESCRIPTION OF THE DRAWINGS

Features of embodiments of the claimed subject matter will become apparent as the following detailed description proceeds, and upon reference to the drawings, in which like numerals depict like parts, and in which:

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

A system according to an embodiment of the present invention captures irregular data access patterns to optimize memory latency and bandwidth. The system also reduces instruction overhead associated with memory accesses, including address computation and data format conversion. In one embodiment, a fast, narrow, multi-channel memory controller saves off-chip bandwidth by supporting efficient scatter/gather operations.

While caches are generally effective at capturing common memory access patterns, they are unable to capture irregular access patterns. An embodiment of a memory system according to the principles of the present invention includes a conventional cache and a scatter/gather engine which cooperate to capture both types of memory access patterns. Furthermore, for irregular access patterns, the memory access overhead may be offloaded to the scatter/gather engine to speed up computation. This separate scatter/gather engine may also begin fetching data from memory before a computation processor requests it, effectively pre-fetching the data. Data coherency is enforced if the same data is accessed by both the cache and the scatter/gather engine.

Figure 1:
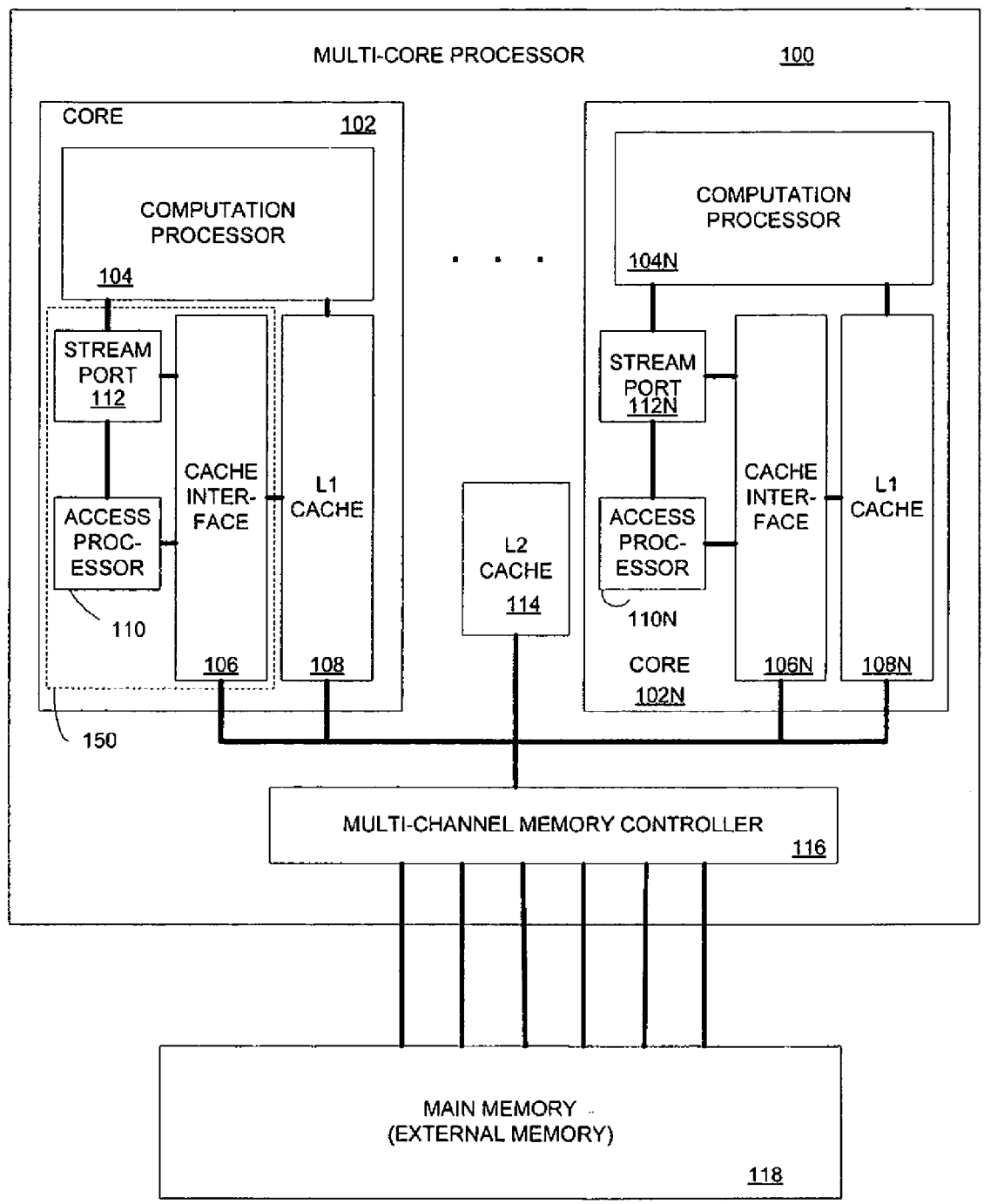
FIG. 1 is a block diagram of an embodiment of a multi-core processor for handling unstructured streaming data according to the principles of the present invention.

FIG. 1 is a block diagram of an embodiment of a multi-core processor 100 for handling unstructured streaming data according to the principles of the present invention. The multi-core processor 100 has a plurality of cores 102, 102N, with each core 102 including a processor ("computation processor") 104 for performing data computations. Each core 102 also includes scatter/gather engine components integrated with a conventional cache hierarchy. In one embodiment, the scatter/gather engine components include a cache interface 106, an access processor 110, and a stream port 112. In one embodiment, each core 102 has a cache hierarchy consisting of a single level of cache ("L1 cache") 108.

Memory bandwidth savings is important in multi-core processors where a large number of cores share a common memory interface having a limited bandwidth. The scatter/gather engine 150 in conjunction with the memory controller 116 reduces off-chip memory bandwidth usage to main memory 118 by allowing data to be accessed in unstructured access patterns. For example, data accesses may be sub-cache line sized data transfers. In addition to reducing bandwidth usage, an embodiment of the scatter/gather engine is fully programmable, has hardware coherence, can hide memory access latency and may overlap memory access overhead with computation.

The multi-core processor 100 may include one or more levels of cache shared amongst the cores 102, 102N. In one embodiment, the cores 102,102N share a single level of cache ("L2 cache") 114.

The multi-core processor 100 also includes a multi-channel memory controller 116. The multi-channel memory controller 116 supports both cache line size data transfers, that is, large sequential accesses to/from cache, and random small-granularity data transfers required by scatter/gather operations for the stream port 112 to off-chip (off-die, on-board, external, or main) memory 118. The main memory 118 may be Rambus Dynamic Random Access Memory (RDRAM), Double Data Rate Dynamic Random Access Memory (DDR RAM), Synchronous Dynamic Random Access Memory (SDRAM) or any similar type memory.

The stream port 112 includes a data buffer, an interface to the computation processor 104, an interface to the access processor 110 and an interface to the cache interface 106. The data buffer in the stream port 112 provides a communication mechanism between the computation processor 104 and the access processor 110.

The access processor 110 is coupled to the stream port 112 and the cache interface 106 and generates memory addresses based on an access pattern. The access processor 110 may be a programmable engine or hardwired logic. The hardwired logic supports limited classes of access patterns, while the programmable engine has flexibility to adapt to any access pattern.

The cache interface 106 is coupled to the stream port 112, access processor 110 and memory controller 116 and provides data coherency between the caches 108 and 114 and the stream port 112. The cache interface 106 also provides an interface to the multi-channel memory controller 116.

Each computation processor 104 has two memory access methods: one through the cache hierarchy (L1 cache (private cache) 108 to Level 2 (L2) cache (shared cache) 114 to main memory 118) and the other through the scatter/gather engine 150 (stream port 112, access processor 110, and cache interface 106) to main memory 118. The multi-channel memory controller 116 provides an interface to main memory 118 to both the cache and the stream port 112.

To avoid wasting memory bandwidth, the scatter/gather engine transfers and buffers only the required data size (called, sub-cache line size data access) based on an access pattern instead of a full cache line. Furthermore, memory access overhead and latency is offloaded by separating memory accesses from data computations, with the access processor 110 preparing operands while the computation processor 104 performs the computations.

To perform a function to compute the operands, the computation processor 104 allocates a stream port 112 and initializes the access processor 110. The stream port 112 provides a communication mechanism between the computation processor 104 and the access processor 110. For a read operation from memory 118, the access processor 110 gathers data from memory 118, and provides the data stream to the computation processor 104. For a write operation to memory 118, the computation processor 104 writes a data stream, and the access processor 110 scatters the data to memory 118. In one embodiment, the data is placed in the stream port 112 in First In First Out (FIFO) order.

A scatter/gather technique carried out by the scatter/gather engine according to an embodiment of the present invention is an application-specific optimization for data intensive applications that do not exhibit spatial or temporal locality. Instead of using a cache to capture spatial and temporal locality, the scatter/gather engine uses pattern locality. Pattern locality is a memory access pattern defined by an application. An application explicitly defines an access pattern and passes it to a scatter/gather engine that exploits the access pattern. Each stream port 112 and access processor 110 includes internal registers that store information required to perform a given scatter/gather operation. This approach is more aggressive than caching in that it communicates data access patterns explicitly rather than relying on spatial or temporal locality of data. The scatter/gather technique is thus an application-specific optimization that can provide performance improvements for applications with little spatial locality and/or little temporal locality. Since the address computation is offloaded to the access processor, it may also provide performance benefits to applications that have high overhead for performing address computations.

An example of an application that may benefit from the scatter/gather engine is an application that uses a stride access pattern, for example, matrix multiplication. The computation processor 104 and access processor 112 may be used to increase the performance of matrix multiplication, with the access processor 112 performing index calculations and the computation processor 104 performing the multiplications. An example of a function for matrix multiplication of three matrices A, B, C that computes C=A×B is shown below. The function assumes that all the matrices (A, B and C) have already been initialized.

```
MatrixMultiply( )
{
// Matrices
int A[N][M], B[M][L], C[N][L];
// C = A * B
for (i=0; i<N; i++)
    for (j=0; j<L; j++)
        for (k=0; k<M; k++)
            C[i][j] += A[i][k] * B[k][j];
}
```

In the MatrixMultiply function shown above, the function may be split into two separate functions, a first function to compute the addresses of and fetch the operands, that is, C[i][j], A[i][k] and B[k][j] and a second function to perform the computation on the operands, that is, A×B. The second function (computation) is performed in the computation processor 104 and the first function (scatter/gather operation) is performed in the access processor 110.

First, the computation processor 104 allocates a stream port 112 and maps an access pattern to the allocated stream port 112. Next, the access processor 110 executes a memory access handler (software or hardware) to perform a scatter/gather operation and places the data in the stream port 112. At the same time, the computation processor 104 accesses the data through the stream port 112. Finally, after finishing an access pattern, the computation processor 104 releases the stream port 112.

In the MatrixMultiply function, matrix B may be optimized because it contains stride accesses, that is, column-wise accesses. A stride access pattern data structure (for example, STRIDE_ACCESS_PATTERN shown below) is allocated and configured for matrix B and stored in the scatter/gather engine. The stride access pattern structure includes fields that are pre-defined, for example, the size of the structure (AccessPatternSize), pointer to a Handler function for the access processor (*Handler) and a read/write flag (Read/Write). The other fields in the stride access pattern data structure are pattern dependent. For this pattern, the starting address of the matrix (StartAddress), the size of the data element (ElementSize), the dimensions of the row and column (RowSize, ColumnSize), and the access repeat number (Repeat) for the pattern are defined.

```
// Stride Access Pattern Data Structure
struct STRIDE_ACCESS_PATTERN
{
unsigned AccessPatternSize;
void (*Handler) (STREAM_PORT, ACCESS_PATTERN);
bool ReadWrite;
unsigned StartAddress;      // &B[0][0]
unsigned ElementSize;       // sizeof(int)
unsigned RowSize;           // L
unsigned ColumnSize;        // M
unsigned Repeat;            // N
}
```

After the stride access pattern has been initialized in the scatter/gather engine, the matrix multiplication function may be modified to use both the access processor 110 and the computation processor 104. An embodiment of a matrix multiply function that executes on the computation processor 104 and uses the scatter/gather engine to compute the addresses of and fetch operands is shown below.

```
MatrixMultiply( )
{
// Matrices
int A[N][M], B[M][L], C[N][L];
// Stream Port
STREAM_PORT PortB;
// Open Port
PortB = OPEN_PORT(WAIT);
// Configure Ports
CONFIGURE_PORT(
    PortB,
    STRIDE_ACCESS_PATTERN(sizeof
    (STRIDE_ACCESS_PATTERN), StrideHandler,
    READ, &B[0][0], sizeof(int), L, M, N));
// C = A * B
for (i=0; i<N; i++)
    for (j=0; j<L; j++)
        for (k=0; k<M; k++)
            C[i][j] += A[i][k] * ReadPort(PortB);
// Close Port
CLOSE_PORT(PortB);
}
```

A stream port 112 is opened for 'PortB' through the "OPEN_PORT" instruction which waits until a port is allocated. After the port is allocated, the port is configured by loading the stride access pattern parameters into a stride access pattern data structure as discussed above. Then, the stream port 112 is configured with the stride access pattern through the "CONFIGURE_PORT" instruction. In this embodiment, portB is initialized as a read port to transfer data from main memory 118 to the computation processor 104.

The data computation is performed on 'PortB' through ReadPort instead of on matrix B. When the matrix multiplication has completed, 'PortB' is closed through 'CLOSE_PORT' in order to release the allocated resources for use by another port.

While the 'MatrixMultiplyo' function executes on the computation processor 104, a 'StrideHandler( )' function shown below executes on the access processor 110. The StrideHandler( ) function executes on an access processor 110 to perform scatter/gather operations. The handler is associated with a particular pattern. In this example, the handler takes two input parameters, port and pattern. A 'port' specifies the communication channel (stream port) to the computation processor 104 and the pattern provides the access pattern information. Based on the information from the access pattern defined in the access pattern data structure, the StrideHandler( ) function obtains the operands for the MatrixMultiply function being executed by the computation processor 104 by calculating a memory address, reading data stored at the calculated memory address and writing the data read (value) to the stream port for use by the computation processor 104.

```
void StrideHandler(STREAM_PORT Port, ACCESS_PATTERN Pattern)
{
// Column-wise access
for (k=0; k<Pattern.Repeat; k++)
    for (i=0; i<Pattern.RowSize; i++)
        for (j=0; j<Pattern.ColumnSize; j++)
        {
            // Read from memory
            Value = ReadMemory(Pattern.StartAddress +
            (i+j*Pattern.RowSize) * Pattern.ElementSize);
            // Write to port
            WritePort(Port, Value);
        }
}
```

The access processor 110 generates a sequence of addresses and communicates them to the cache interface 106 via the ReadMemory instruction. The cache interface 106 fetches the data into the stream port 112. If the data already resides in L1 cache 108, L2 cache 114 or even another stream port 112, the cache interface 106 gets the data from the corresponding cache or stream port 112. Otherwise, the multi-channel memory controller 116 gets the data from the main memory 118. Finally, the computation processor 104 reads or writes the data through the stream port 112 dependent on whether the port is initialized as a read port or a write port.

In the embodiment shown, a programmable access processor executes a memory access software shown as 'StrideHandler( )' above. However, in other embodiments, the same functionality as 'StrideHandler( )' can be implemented as hardwired logic. A programmable access processor provides flexibility to support many access patterns, while hardwired logic provides higher performance and power efficiency at the cost of reduced flexibility.

In one embodiment, the stream port 112 supports a streaming data access model. In the streaming data access model, after the data is accessed, it is immediately discarded from the buffer (in the case of a read operation) in the stream port 112 or written back to the memory 118 (in the case of a write operation).

A data coherence issue may arise between the cache hierarchy and the stream port 112. For example, the computation processor 104 may access data through the stream port 112 while the same data is buffered in the cache hierarchy, or the computation processor 104 may access data through the cache hierarchy while the data is buffered in the steam port.

Data coherence is supported by enforcing mutual exclusion. The cache interface 106 monitors memory accesses through both the cache hierarchy and the stream port 112 and takes corresponding coherence actions. If there is a request to access data through the cache hierarchy, the same data is invalidated from the stream port 112. Similarly, if there is a request to access data through the stream port 112, the same data is invalidated in the cache hierarchy. Thus, data coherence is guaranteed because valid data can only be stored in either the cache hierarchy or in the buffer in the stream port 112.

In one embodiment, a directory-based coherence protocol is modified to treat the stream port 112 as another cache and maintain a directory entry accordingly. For a read miss, the directory is consulted to find the current owner of the data, from which the most recent data is obtained. For a write miss, the directory is consulted to find all owners of copies of the data. The copies are invalidated and ownership is obtained.

The method for invalidating data in the cache is the same as in conventional directory-based protocols. However, invalidating data in the stream port 112 requires a different mechanism from the cache due to the streaming data organization. First, the cache maintains data at a cache line size granularity, so tag overhead is tolerable. However, because the stream port 112 manages data at a byte granularity, in the worst case, tag overhead is extremely large. Second, the data is placed in the stream port 112 in First In First Out (FIFO) order. Therefore, the stream port 112 requires a fully associative search on coherence actions because the corresponding data can be located in any position within the data buffer in the stream port 112. The logic for fully associative searches is physically large and consumes much more power than simpler searches. Therefore, a cache-like invalidation mechanism is prohibitively expensive for the stream port 112. For example, a cache-like invalidation mechanism for stream port 112 with a 1 KB data buffer would require 8 KB of tags (64 bit address tag per 1 byte data), and logic for performing 1024 concurrent comparisons (full search for 1K entries).

Assuming that most programs access a given data item either through the cache or the stream port 112 but not both, that is, programs will not frequently communicate data between the cache and the stream port 112 concurrently, instead of maintaining an address tag per data element, an address range per stream port 112 is maintained at stream port 112 and at all levels of shared cache, just L2 cache 114 in the shown embodiment. The address range keeps track of the lower and upper bound of addresses that are currently buffered in the stream port 112. Whenever a stream port 112 accesses data, the address range is extended, if necessary, to contain the new data item. For example, if a stream port 112 accesses addresses in the order of 0x10, 0x09, 0x05, and 0x07, the address range for the stream port 112 changes from (0x10,0x10), to (0x09,0x10), to (0x05,0x10), and to (0x05, 0x10). When the shared caches, just L2 cache 114 in the shown embodiment, determine the set of owners of a piece of data, they compare the address of the data to the address ranges of all stream ports 112. All stream ports 112 with matching ranges are considered owners of a copy of the data. When the stream port 112 gets an invalidation request, the requested address is compared against the address range. If there is a match, the entire stream port 112 is invalidated, not just the corresponding data.

Figure 2:
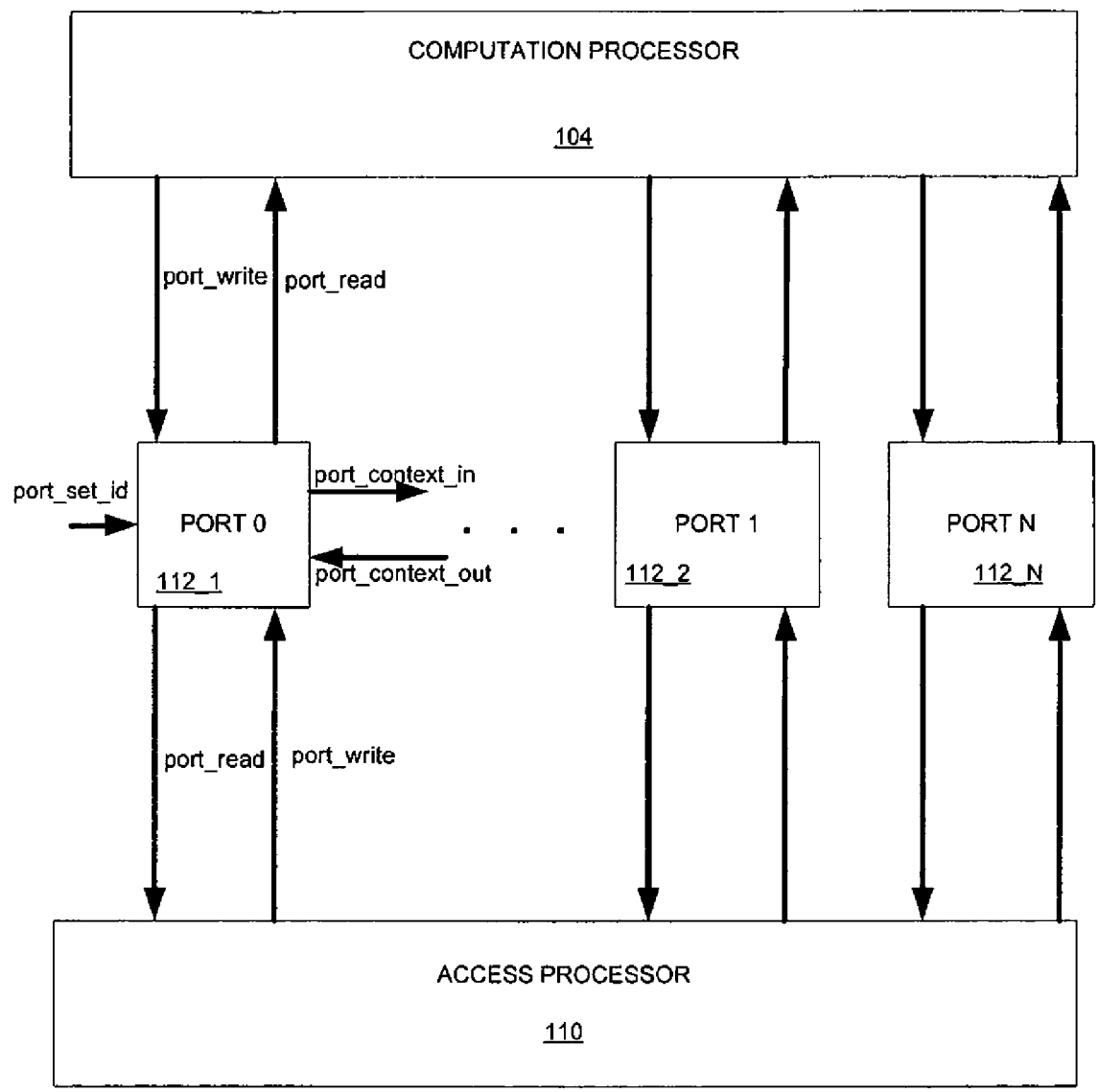
FIG. 2 is a block diagram illustrating a plurality of stream ports providing a communication mechanism between the computation processor and the access processor in the multi-core processor shown in FIG. 1.

FIG. 2 is a block diagram illustrating a plurality of stream ports for providing a communication mechanism between the computation processor 104 and the access processor 110 in the multi-core processor 100 shown in FIG. 1. Each of the stream ports 112_1, . . . 112_N includes a stream port context and a data buffer. The stream port context maintains control information for a stream port 112 and the data buffer temporarily stores data.

A set of instructions and library functions are provided to manage and access any one of the stream ports 112_1 . . . 112_N shown in FIG. 2.

The operation type of a stream port 112 may be indicated by the status of a "Port_Type" which indicates whether the operation type is a read or a write. In one embodiment, for a stream port having a read operation type, the computation processor 104 can only execute 'port_read' instructions, while the access processor 110 can only execute 'port_write' instructions. For a stream port 112 having a write operation type, the opposite restrictions are applied. Synchronization is implicit in the 'port_read' and 'port_write' instructions. For example, a 'port_read' instruction stalls if there is no data ready in the stream port 112, while a 'port_write' instruction stalls if there is no empty space in the stream port 112.

In one embodiment, the data buffer in each stream port 112 is dual-ported allowing the computation processor 104 and the access processor 110 to read or write concurrently. Different sizes of data accesses such as 1, 2, 4, 8, and 16 bytes are supported. Data format conversion, such as, size-extension, zero-extension, truncation or saturation, may be performed.

The stream port 112 and access processor 110 may be managed by an operating system. For example, the operating system may maintain a resource table to track a free resource list and indicate which computation processor 104 has allocated a particular stream port 112 and access processor 110.

Functions (instructions) to open and close a stream port 112 are provided to allow user applications to allocate (open) or release (close) a particular stream port 112 and access processor 110. Instructions may also be provided to provide data protection and to manage the access processor 110.

Availability of a stream port 112 and access processor 110 is not guaranteed. Thus, when issuing an instruction to allocate a port (open_port), a user application may wait until a stream port 112 and access processor 110 are available or may access memory through the cache instead of the stream port 112 upon receiving an indication that the stream port 112 is not available.

When a stream port 112 is allocated to a computation processor 104, a process identifier (ID) associated with the stream port 112 is set to be the same as the process ID of the computation processor 104. Each stream port 112 has an internal register for storing the process ID associated with the stream port 112. The process ID may be set through the use of the 'port_set_id' instruction.

Data protection is provided through the use of the process ID. A computation processor 104 is prevented from accessing an incorrect stream port because instructions to read and write data (port_read, port_write) to/from the stream port 112 are valid only if the process IDs of the computation processor 104 and the process ID stored in the internal register in the stream port 112 match.

A resource table may be used to locate the access processor 110 that has been allocated to a particular computation processor 104. When an access processor 110 is configured, for example, through a specialized instruction (ap_launch), the access processor's internal registers are initialized and the program counter is initialized with the handler's address (or function pointer). Thus, a computation processor 104 may only run a handler on the access processor 110 that has been allocated to the computation processor, thereby providing access processor-level protection.

Memory addresses accessible to the access processor 110 may be restricted to those accessible to the computation processor 104 associated with the access processor 110 and stream port 112. The memory address restriction may be performed by an address translation mechanism based on process ID. An instruction, for example, 'ap_set_id' may be provided to set the process ID of the access processor 110.

The computation processor 104 may be multi-threaded with each thread having its own context, that is, program counter and thread-local registers. Each thread has an associated state which may be inactive, executing, ready to execute or asleep. When a thread of a computation processor 104 is switched out, that is, there is a context switch; all the allocated stream ports 112 and access processors 110 for that thread are also released. Later when the thread is switched back in, the stream ports 112 and access processors 110 are allocated again. Instructions (port_context_in, port_context_out) are provided for performing a context switch. These instructions save or load a stream port context.

To switch out a thread, that is, perform a context switch, a 'port_context_out' instruction is issued for each of the stream ports and an 'ap_context_out' instruction is issued for each of the access processors 110 allocated to the thread. Then, the resource table is updated.

For write ports, the context switch is performed after the data elements in the stream port 112 are written to the memory. In one embodiment, the 'port_context_out' instruction writes all the internal register values of the stream port to memory and the 'ap_context_out' instruction writes all the internal register values of the access processor to the memory.

To switch a thread in, the resource table is checked to determine if the required stream ports and access processors are available. If so, the stream ports and access processors are allocated. A 'port_context_in' instruction is issued for each allocated stream port and an 'ap_context_in' instruction is issued for each of the access processors.

The context switch instructions store and load only the access pattern information, that is, control information. For write ports, the buffer is always empty when a context switch happens, as explained earlier. For read ports, the data that was thrown away on a context switch is re-fetched when the context is switched back in.

Thread migration is handled by a similar mechanism. If a thread migrates from one computation processor 104 to another computation processor 104N, all of the stream ports and access processors are released from the old computation processor 104N. New resources are allocated in the other computation processor 104N. If the required resources are not available in the other computation processor 104N, the thread may be switched out from the computation processor 104. The thread then waits in a suspended state in the other computation processor 104N.

Figure 3:
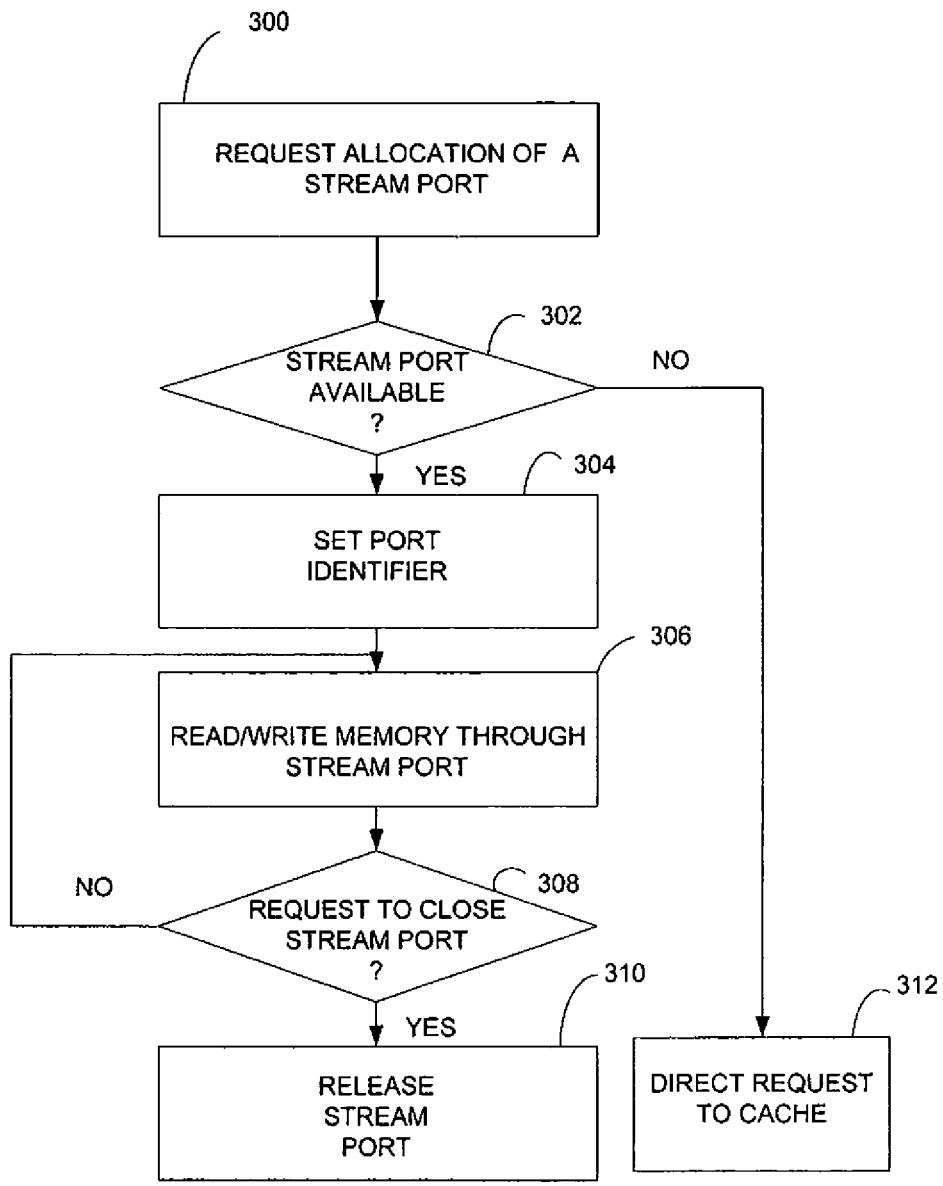
FIG. 3 is a flow chart of an embodiment of a method for managing and accessing any one of the stream ports shown in FIG. 2.

FIG. 3 is a flow chart of an embodiment of a method for managing and accessing any one of the stream ports shown in FIG. 2.

At block 300, an 'open_port' instruction is issued to allocate a stream port. Processing continues with block 302.

At block 302, when issuing an 'open_port' instruction to allocate a port, the availability of a stream port 112 and access processor 110 is not guaranteed. Thus, the 'open_port' instruction may include a time period to wait for an available stream port. Upon receiving an indication that the stream port is available, processing continues with block 304. If a stream port is not available, processing continues with block 312 to access memory through the cache instead of the stream port 112.

At block 304, after a stream port 112 is allocated to a computation processor 104, the process identifier (ID) of the stream port 112 is set to be the same as the process ID of the computation processor 104. Each stream port 112 has an internal register for storing the process ID associated with the stream port 112. For example, a 'port_set_id' instruction may be issued to set a process identifier field with the identifier of the process that owns the allocated stream port 112.

At block 306, after the stream port 112 has been allocated and the port ID set, 'port_read' and 'port_write' instructions may be issued to read and write data, respectively, through the stream port instead of through the cache hierarchy. Data protection is provided through the use of the process ID, as described above.

At block 308, if a request is received from the computation processor 104 to close the stream port, for example, through a 'close port' instruction, processing continues with block 310. If not, processing continues with block 306, to process read or write requests directed through the stream port.

At block 310, the stream port is closed and releases allocated resources.

At block 312, requests for the stream port are rejected. Programmers have two choices: to wait and retry, or to use the cache hierarchy instead of stream ports.

Figure 4:
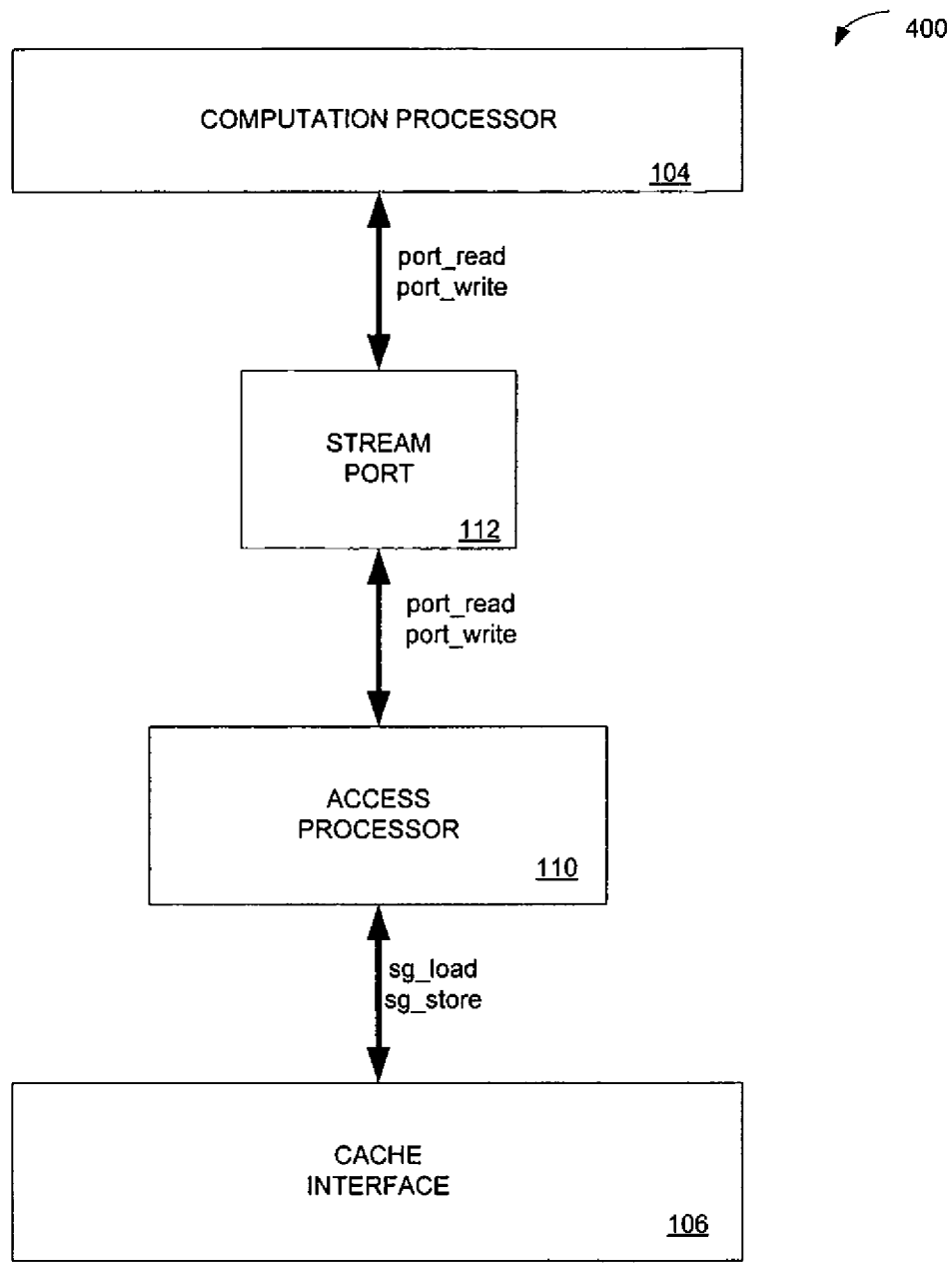
FIGS. 4 and 5 are block diagrams of embodiments of scatter/gather engines that include access processors having a programmable engine.
Figure 5:
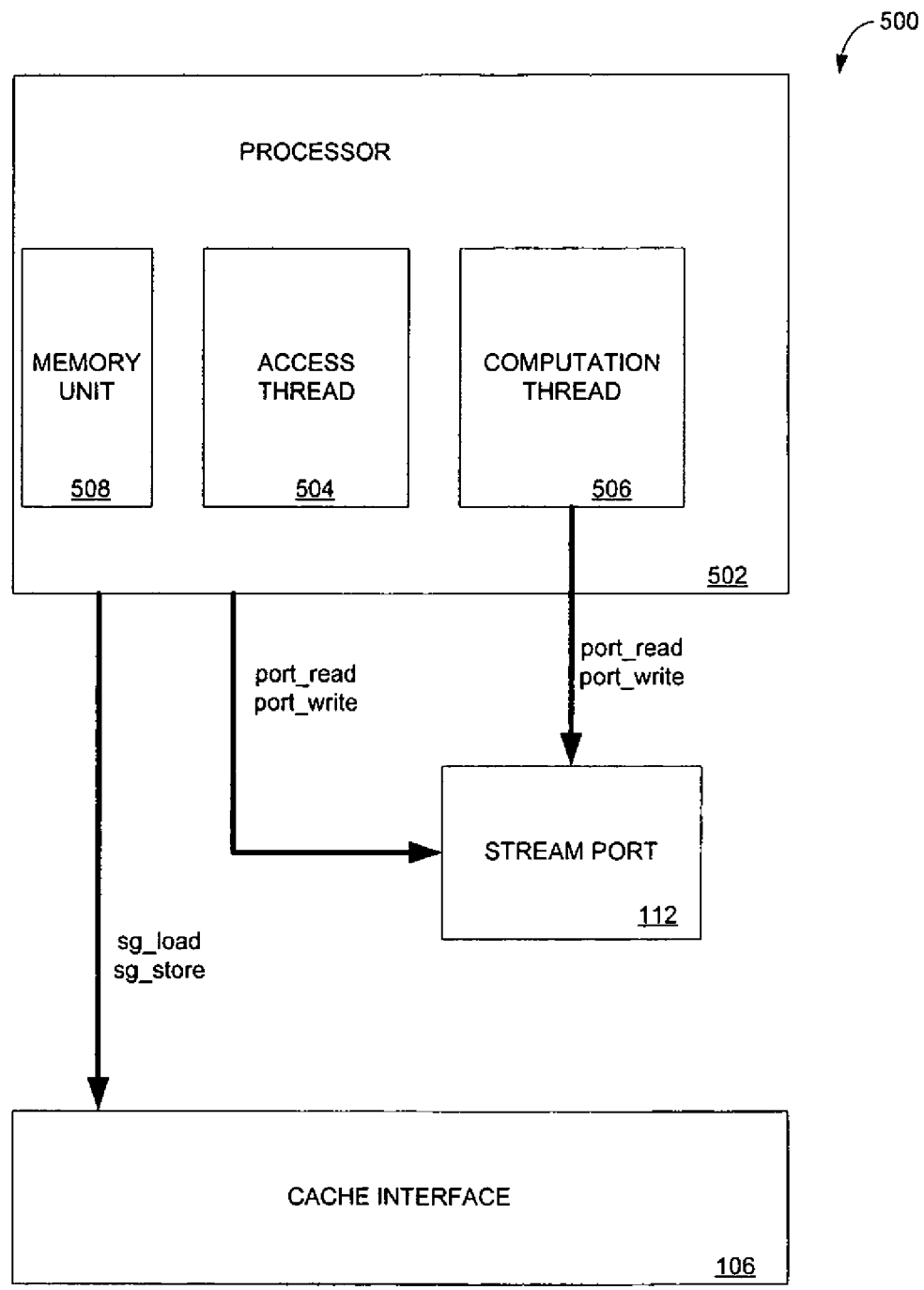

FIGS. 4 and 5 are block diagrams of embodiments of scatter/gather engines 400, 500 that include access processors having a programmable engine. The programmable engine has the flexibility to adapt to any access pattern and is useful when support for many different access patterns is required. In the embodiment shown in FIG. 4 the scatter/gather engine includes a stream port 112, access processor 110 and cache interface 106.

Referring to FIG. 4, the computation processor 104 may be any conventional processor that includes support for the stream port instructions described earlier. The access processor 110 is a programmable engine or dedicated processor which is optimized for address calculation and memory accesses. In one embodiment, the access processor 110 does not include arithmetic units such as a multiplier or a divider, but does include multiple adders or shifters for fast address calculation.

The access processor 110 gathers data read from main memory 118 and forwards it to the computation processor and scatters data received from the computation processor 104 to the main memory 118. Thus, the access processor 110 has two data access interfaces, one for the computation processor 104 and the other to main memory 118. The interface with the computation processor 104 is through the stream port 112 and the interface to memory is through the multi-channel memory controller 116. The access processor 110 issues scatter/gather load and store requests ('sg_load', 'sg_store') to main memory 118 to perform scatter/gather operations. The scatter/gather load and store requests take advantage of sub-cache line-granularity data transfer supported by the multi-channel memory controller 116. For example, in response to a 'port_read' request received from the stream port 112, the access processor generates 'sg_load' requests to the memory to access the data in a sub-cache line size.

Turning to FIG. 5, in this embodiment, the functions of the access processor 110 shown in FIG. 4 are implemented in an access thread 504 that runs in a simultaneous multithreading (SMT) processor 502. The SMT processor 502 runs both a computation thread 506 and the access thread 504. In another embodiment, multiple cores on a Chip-Level Multiprocessing (CMP) architecture processor may be used, such that the computation thread 506 is run on one core and the access thread 504 on another core. This embodiment uses the 'port read' and 'port write' instructions and also includes a memory unit 508 with scatter/gather load and store instructions ('sg_load', 'sg_store') used by the access thread 504 to perform the scatter/gather memory accesses through the cache interface.

Figure 6:
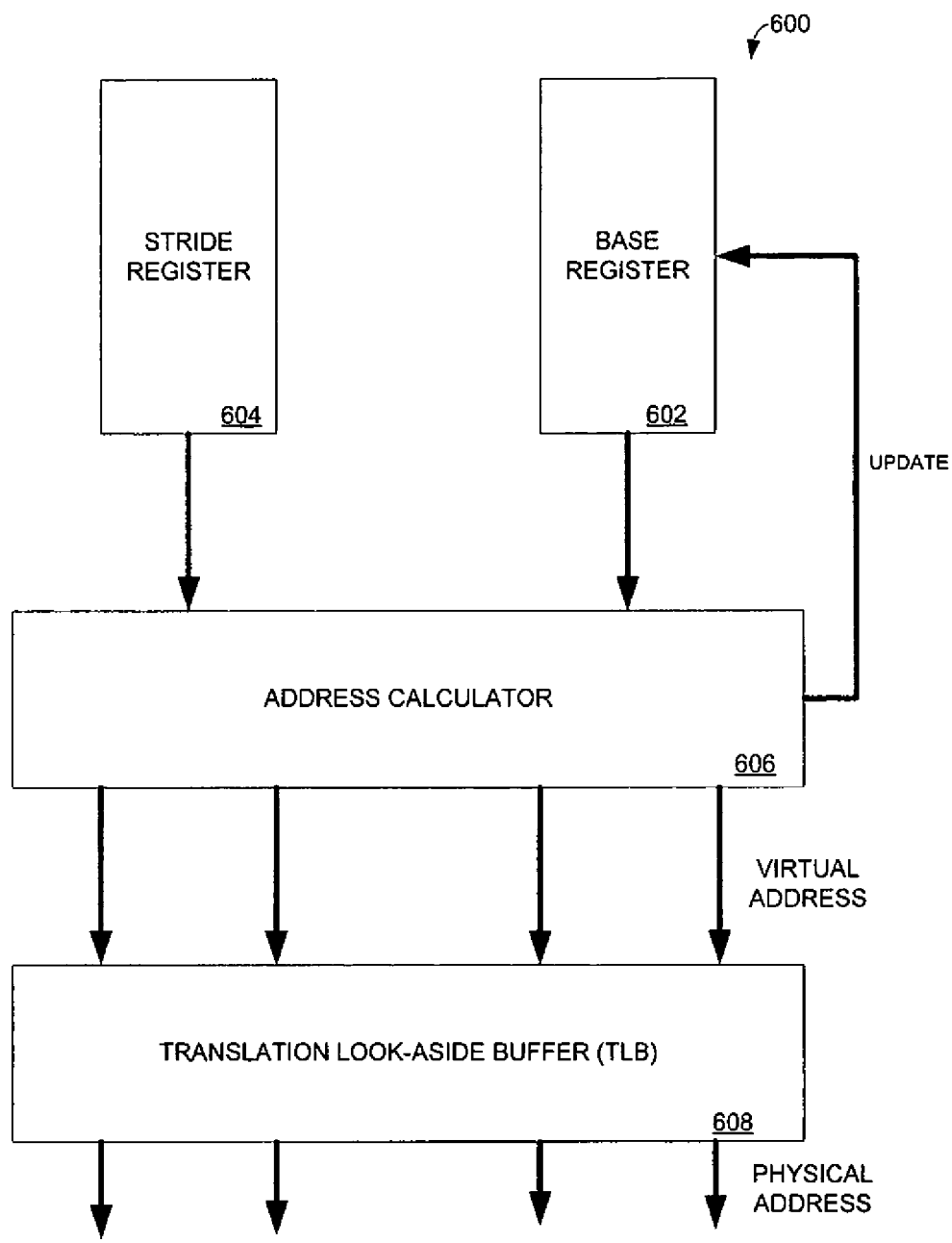
FIGS. 6 and 7 are block diagrams of embodiments of access pattern generators that may be included in the access processor shown in FIG. 1.
Figure 7:
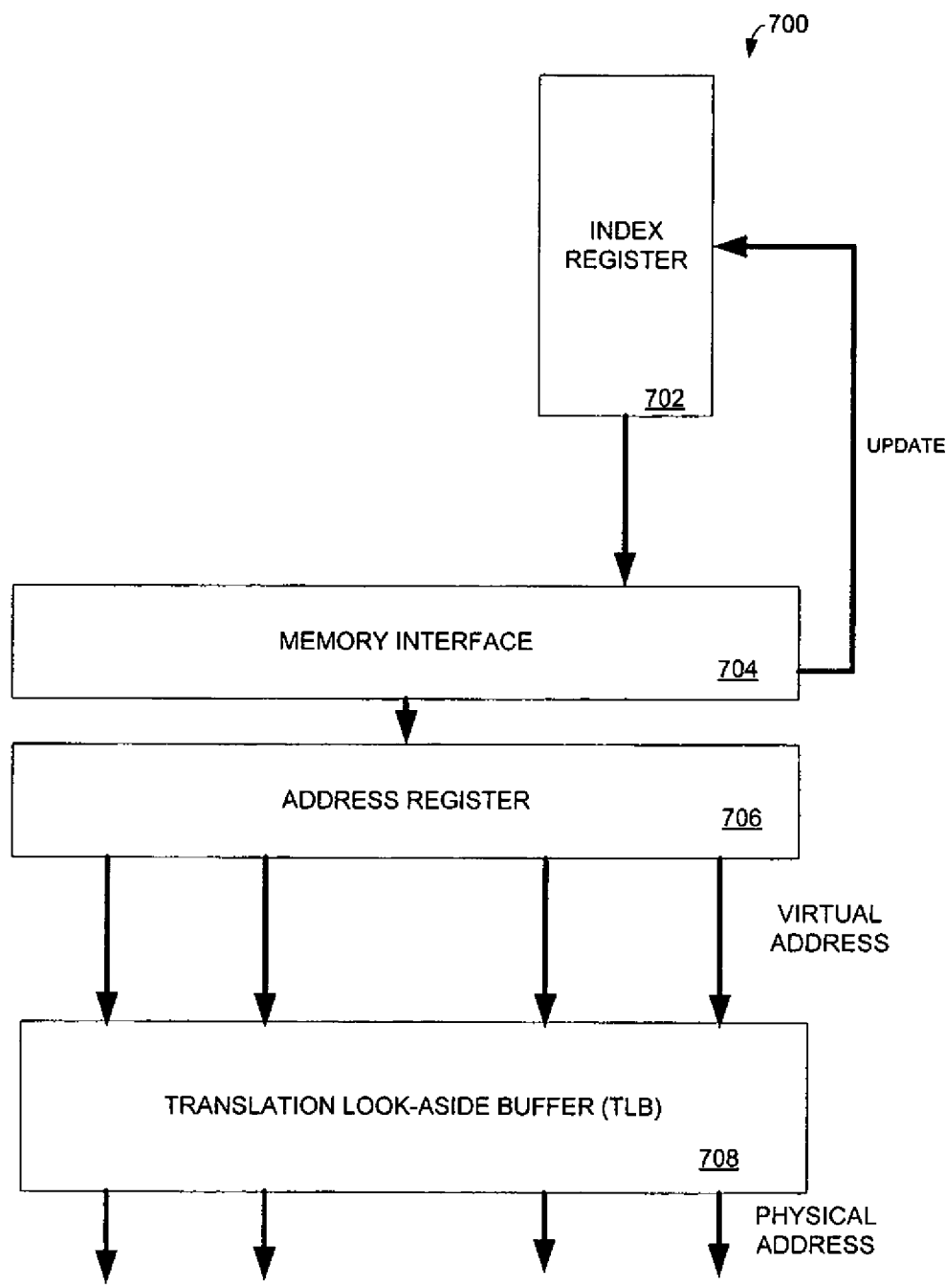

Dedicated access pattern generators may be included in an access processor 110 when a number of access patterns are limited. FIGS. 6 and 7 are block diagrams of embodiments of access pattern generators that may be included in the access processor 110 shown in FIG. 1 for optimizing address computations.

Referring to FIG. 6, an embodiment of an access pattern generator 600 that may be included in the access processor shown in FIG. 1 is shown. The access pattern generator 600 is specialized for stride access patterns which may access non-consecutive addresses, for example, 1, 5, 9, . . . . Two internal registers (Base Register 602, Stride Register 604) are set by the computation processor 104 for the particular access pattern. The 'Base Register' 602 stores the virtual memory address of the first data element and the 'Stride Register' 604 stores the stride between consecutive memory elements. For example, the stride is 4 for stride access pattern 1, 5, 9. The address calculator 606 computes virtual memory addresses by adding the contents of the base register 602 and the contents of the stride register 604. The Translation Look-aside Buffer (TLB) 608 is used to translate the virtual memory addresses to physical memory addresses.

For example, the base register 602 may be initialized to 0xF0000 and the stride register initialized to 4, the address calculator calculates the next address by adding 4 to 0xF0000 and outputs virtual memory addresses 0xF0004, 0xF0008, 0xF000C etc.

Turning to FIG. 7, another embodiment of an address generator is shown. The address generator 700 generates an indirect access pattern. Addresses are not calculated directly. Instead, the computation processor 104 initializes the 'Index Register' 702 with the address of an index vector. Then, the memory interface 704 loads the index vector element stored in memory into the 'Address Register' 706. Finally, the TLB 708 translates the virtual address received from the address register 706 to a physical address.

For example, sparse matrix dense vector multiplication is an example of an application that may use an indirect access pattern. The function shown below performs sparse matrix dense vector multiplication. The function computes C=A×B, where A is a sparse matrix and B and C are dense vectors.

```
SparseMatrixDenseVectorMultiply( )
{
// A: Sparse Matrix in Compressed Row Storage Format
// B, C: Dense Vectors
int Arow[N], Acol[NonZero], Adata[NonZero];
int B[N], C[N];
// C = A * B
for (i=0; i<N; i++)
    for (j=Arow[i]; j<Arow[i+1]; j++)
        C[i] += A[j] * B[Acol[j]];
}
```

An indirect access pattern data structure is set up for the indirect access pattern for matrix B as shown below. The pattern data structure is similar to the stride access pattern described earlier, but, in this case the indirect access pattern data structure defines the starting address of the data vector (DataAddress), the starting address of the index vector (IndexAddress), the size of the data element (ElementSize), and the length of the stream (StreamLength).

```
// Indirect Access Pattern Data Structure
struct INDIRECT_ACCESS_PATTERN
{
    unsigned AccessPatternSize;
    void (*Handler) (STREAM_PORT, ACCESS_PATTERN);
    bool ReadWrite;
    unsigned DataAddress;      // &B
    unsigned IndexAddress;     // &Acol
    unsigned ElementSize;      // sizeof(int)
    unsigned StreamLength;     // NoneZero
}
```

The sample code shown below may be executed on the computational processor 104 and is the scatter/gather version of the sparse matrix dense vector multiplication code.

```
SparseMatrixDenseVectorMultiply( )
{
// Matrix and Vectors
int Arow[N], Acol[NonZero], Adata[NonZero];
int B[N], C[N];
// Stream Port
STREAM_PORT PortB;
// Open Port
PortB = OPEN_PORT(WAIT);
// Configure Ports
CONFIGURE_PORT(
    PortB,
    INDIRECT_ACCESS_PATTERN(sizeof
    (INDIRECT_ACCESS_PATTERN), IndirectHandler, READ,
    &B, &Acol, sizeof(int), NonZero));
// C = A * B
for (i=0; i<N; i++)
    for (j=Arow[i]; j<Arow[i+1]; j++)
        C[i] += A[j] * ReadPort(PortB);
// Close Port
CLOSE_PORT(PortB);
}
```

The 'IndirectHandler( )' function shown below may be executed on the access processor 110. In one embodiment, hardwired logic shown in FIG. 7 performs the same operation. The 'IndirectHandler( )' function loads the index value, calculates the data address, reads the memory, and writes the value to the stream port 112.

```
void IndirectHandler(STREAM_PORT Port, ACCFSS_PATTERN
Pattern)
{
// Indirect Access
for (i=0; i<PatternStreamLength; i++)
{
    // Calculate index
    Index = ReadMemory(Pattern.IndexAddress + i);
    // Read from memory
    Value = ReadMemory(Pattern.DataAddress +
    (Index*Pattern.ElementSize));
    // Write to port
    WritePort(Port, Value);
}
}
```

Returning to FIG. 1, the cache interface 106 provides data coherence between the caches (L1 cache 108, L2 cache 114) and the stream port. After the access processor 110 calculates addresses, it requests the cache interface 106 to load data to the stream port 112 or store data from the stream port 112. In the memory hierarchy shown in FIG. 1, the target data to read or the target buffer to write can be located in the L1 cache of the local core 102, the L1 cache 108N of a remote core 102N, the shared L2 cache 114, or in the main memory 118. In addition, the target data can be also located in the stream port 112 of the local core 106 or in the stream port 112N of a remote core 106N. The cache interface 106 identifies the correct target location.

A similar situation arises when the computation processor 104 loads or stores data through the cache. The target location can be in the L1 cache 108 of the local core 102, the L1 cache 108N of a remote core 102N, the L2 cache 114, the main memory 118, the stream port 112 of the local core 102, or the stream port 112N of a remote core 102N. In a conventional multiprocessor system, a cache coherence protocol enables the computation processor 104 to obtain an up-to-date copy of the data with necessary access permission. However, due to the addition of the stream port 112, the coherence protocol is extended to support data coherence between cache and stream ports.

In one embodiment, the cache interface is directly connected to the multi-channel memory controller 116. For every request for the stream port 112, the cache interface 106 issues the request to the multi-channel memory controller 116, and loads/stores data from/to the main memory 118 regardless of the actual target location.

For example, if core 102 writes a data location through the cache 108, the corresponding cache line is fetched into cache 108 in the dirty exclusive state. Later, if core 102N tries to read the same location through the stream port 112N, the cache interface 106N loads stale data from the main memory 118, because cache 106N does not know that core 102 has the most recent data in its L1 cache 108. To prevent this data incoherence, the cache line is flushed from cache 108 as well as L2 cache 114 to the main memory 118 before core 102N reads the data location. Appropriate synchronization is performed between the write to the cache by core 102 and the read from the stream port 112N by core 102N.

In another embodiment, the cache interface 106 provides full data coherence support. Whenever the computation processor 104 accesses the stream port 112, the cache interface 106 locates the correct location of the most up-to-date data. In this embodiment, the cache interface 106N of core 102N determines that cache 108 has the most up-to-date data, thus cache interface 106N gets the data from cache 108 instead of from main memory 118. The conventional cache guarantees data coherence only for the cache, not for the stream port 112. For example, if core 106 tries to read a data location through the cache when the stream port 112N of core 106N has the same data, the cache coherence protocol is extended so that the cache can get the data from the stream port 112N of core 106N.

The embodiments of the access processor described in conjunction with FIGS. 6 and 7 may provide better performance than the embodiments described in conjunction with FIGS. 4 and 5 for applications that access the same data concurrently through the cache and stream ports 112, 112N, that is, if a high volume of communication between the cache and the stream port 112 is required. Otherwise, the embodiments of the access processor described in conjunction with FIGS. 4 and 5 are better because they do not suffer from coherence overhead and are less expensive in terms of space and power requirements.

Figure 8:
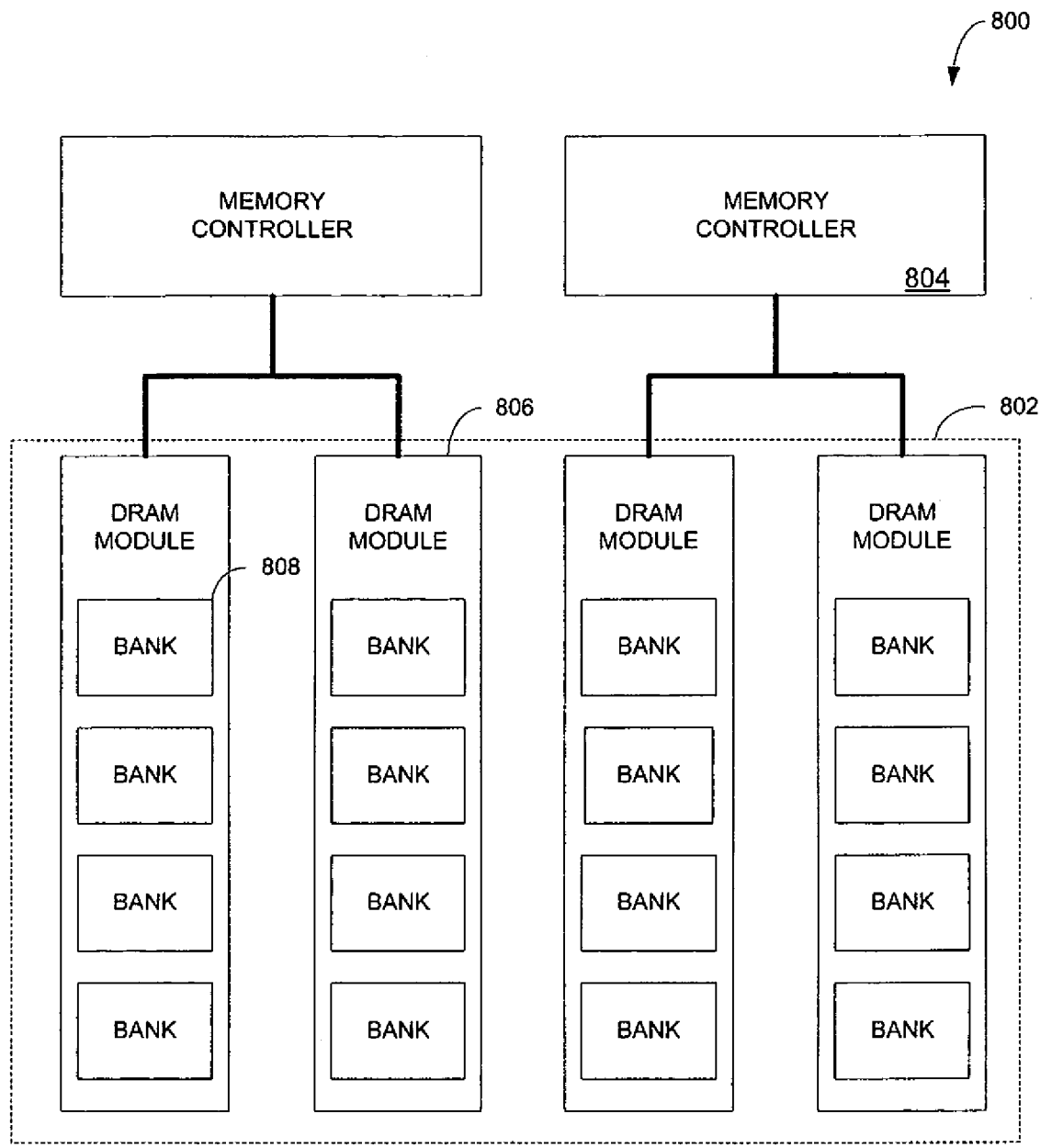
FIG. 8 is a block diagram of an embodiment of a memory system that supports both cache line size data transfer and sub-cache line size data transfer.

FIG. 8 is a block diagram of an embodiment of a memory system 800 that supports both cache line size data transfer and sub cache-line size data transfer. The memory space 802 is divided into multiple channels 806 and each channel 806 is divided into multiple banks 808. Conventional memory systems like Double Data Rate Dynamic Random Access Memory (DDR RAM) provide a small number of broad memory access channels. Although they are efficient for large cache line size data transfers, the scatter/gather architecture requires sub cache line size data transfers. In the embodiment in FIG. 8, a plurality of channels 806 are assigned to each memory controller 804 to provide a fast, narrow, multi-channel memory controller to support efficient scatter/gather operations. The multi-channel memory controller 804 saves off-chip memory bandwidth, and also reduces memory access latency. The scatter/gather technique improves off-chip bandwidth efficiency by accessing data at a smaller granularity than usual, allowing only useful data to be fetched based on a given access pattern.

It will be apparent to those of ordinary skill in the art that methods involved in embodiments of the present invention may be embodied in a computer program product that includes a computer usable medium. For example, such a computer usable medium may consist of a read only memory device, such as a Compact Disk Read Only Memory (CD ROM) disk or conventional ROM devices, or a computer diskette, having a computer readable program code stored thereon.

While embodiments of the invention have been particularly shown and described with references to embodiments thereof, it will be understood by those skilled in the art that various changes in form and details may be made therein without departing from the scope of embodiments of the invention encompassed by the appended claims.

What is claimed is:

1. A processor comprising:
a plurality of cores including a first core having:
a computation processor; and
a programmable engine coupled to the computation processor to perform address calculation and memory accesses, the programmable engine to generate sub-cache line sized non-sequential data accesses to a memory based on an access pattern to communicate sub-cache line sized data with the memory, the access pattern explicitly provided by an application, wherein the programmable engine is to store a stride access pattern data structure to be allocated for a first matrix of a matrix multiply function; and
a cache coupled to the first core, wherein data is to be transferred between the cache and the memory via a full-cache line sized transfer.

2. The processor of claim 1, wherein the programmable engine includes an access processor, an access pattern generator, and a cache interface.

3. The processor of claim 2, wherein the access processor is to compute memory addresses for the sub-cache line sized non-sequential data accesses and perform data format conversion.

4. The processor of claim 2, wherein the access processor is to prepare an operand while the computation processor is to perform a computation.

5. The processor of claim 2, wherein the access processor is to generate the sub-cache line sized non-sequential data accesses to the memory based on an indirect access pattern.

6. The processor of claim 5, wherein the indirect access pattern comprises a sparse matrix dense vector multiplication.

7. The processor of claim 2, wherein the access pattern generator is to generate the sub-cache line sized non-sequential data accesses to the memory based on a stride-based access pattern.

8. The processor of claim 2, wherein the computation processor and the access processor are to be associated with a same process identifier.

9. The processor of claim 2, wherein the programmable engine further comprises:

a stream port coupled to the computation processor, the stream port including a buffer to store ordered data accessible by the access processor and the computation processor.

10. The processor of claim 9, wherein the buffer comprises a first port and a second port to enable the computation processor and the access processor to concurrently access the buffer.

11. The processor of claim 9, wherein the computation processor is to allocate the stream port, map the access pattern to the stream port, and wherein the access processor is to execute a memory access handler to perform a scatter/gather operation to place the sub-cache line sized data in the stream port.

12. The processor of claim 11, wherein the memory access handler is to receive a port value to identify the stream port and a pattern value to identify the access pattern.

13. The processor of claim 1, wherein the computation processor is to perform data computations for the first matrix using a stream port of the access processor.

14. A system comprising:
a multicore processor having a plurality of cores including a first core having a computation processor and a programmable engine to perform address calculation and memory accesses to generate sub-cache line sized non-sequential data accesses to a memory based on an access pattern and communicate sub-cache line sized data with the memory, a first memory controller and a second memory controller, the access pattern explicitly provided by an application, wherein the programmable engine is to store a stride access pattern data structure to be allocated for a first matrix of a matrix multiply function; and
the memory coupled to the multicore processor, the memory including a first plurality of channels associated with the first memory controller and a second plurality of channels associated with the second memory controller.

15. The system of claim 14, wherein each of the first plurality of channels are to be used to perform scatter/gather operations.

16. The system of claim 14, wherein the memory is to support cache line size data transfer and sub-cache line size data transfer.

17. A non-transitory machine-accessible storage medium including instructions that when executed cause a system to perform a method comprising:
performing, in a programmable engine coupled to a computation processor of a core, address calculation and memory accesses;
generating, in the programmable engine, sub-cache line sized non-sequential data accesses to a memory based on an access pattern;
storing, in the programmable engine, a stride access pattern data structure to be allocated for a first matrix of a matrix multiply function; and
communicating sub-cache line sized data with the memory, the access pattern explicitly provided by an application, wherein the memory supports cache line size data transfer and sub-cache line size data transfer.

18. The non-transitory machine-accessible storage medium of claim 17, wherein the method further comprises:
computing, by an access processor of the programmable engine, memory addresses for the sub-cache line sized non-sequential data accesses; and
performing, in the access processor, data format conversion.

19. The non-transitory machine-accessible storage medium of claim 18, wherein the method further comprises preparing, by the access processor, an operand while the computation processor performs a computation.

* * * * *